(12) United States Patent
Moschiano et al.

(10) Patent No.: US 7,751,246 B2
(45) Date of Patent: Jul. 6, 2010

(54) CHARGE LOSS COMPENSATION DURING PROGRAMMING OF A MEMORY DEVICE

(75) Inventors: Violante Moschiano, Bacoli (IT); Michele Incarnati, Gioia dei Marsi (IT); Giovanni Santin, Vazia (IT); Danilo Orlandi, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 12/177,972

(22) Filed: Jul. 23, 2008

(65) Prior Publication Data

US 2009/0219761 A1   Sep. 3, 2009

(30) Foreign Application Priority Data

Feb. 29, 2008   (IT)   ............... RM2008A0114

(51) Int. Cl.
*G11C 16/04* (2006.01)

(52) U.S. Cl. ............... 365/185.19; 365/185.22; 365/185.17

(58) Field of Classification Search ............ 365/185.19, 365/185.22, 185.17
See application file for complete search history.

(56) References Cited

U.S. PATENT DOCUMENTS

| 7,073,103 | B2* | 7/2006 | Gongwer et al. ............ 714/718 |
| 7,206,231 | B2* | 4/2007 | Wan et al. ............. 365/185.22 |
| 7,324,383 | B2 | 1/2008 | Incarnati et al. |
| 7,508,715 | B2* | 3/2009 | Lee ....................... 365/185.22 |
| 2007/0047318 | A1 | 3/2007 | Nagai et al. |
| 2007/0230250 | A1 | 10/2007 | Chan |

* cited by examiner

*Primary Examiner*—Huan Hoang
(74) *Attorney, Agent, or Firm*—Leffert Jay & Polglaze, P.A.

(57) ABSTRACT

A selected memory cell on a selected word line is programmed through a plurality of programming pulses that are incremented by a step voltage. After a successful program verify operation, programming of the selected memory cell is inhibited while other memory cells of the selected word line are being programmed. Another program verify operation is performed on the selected memory cell. If the program verify operation fails, a bit line coupled to the selected cell is biased at the step voltage and a final programming pulse is issued to the selected word line. The selected memory cell is then locked from further programming without evaluating the final program verify operation.

23 Claims, 7 Drawing Sheets

CHARGE LOSS COMPENSATION DURING PROGRAMMING OF A MEMORY DEVICE

RELATED APPLICATION

This application claims priority to Italian Patent Application Serial No. RM2008A000114, filed Feb. 29, 2008, entitled "CHARGE LOSS COMPENSATION DURING PROGRAMMING OF A MEMORY DEVICE," which is commonly assigned.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

During a typical prior art programming operation of a flash memory cell, a selected word line coupled to the selected memory cell to be programmed is biased with a series of incrementing voltage programming pulses that start at an initial voltage that is greater than a predetermined programming voltage (e.g., approximately 16V). The programming pulse increases a charge level, thereby increasing the cell's threshold voltage $V_t$, on a floating gate of the memory cell. After each programming pulse, a verification operation with a word line voltage of 0V is performed to determine if the cell's threshold voltage has increased to the desired programmed level.

Immediately after programming, the floating gate can experience multiple forms of charge loss that occur at the time of ion implantation that can cause defects in the data retention characteristics of the floating gate. These include single bit charge loss, intrinsic charge loss, and quick charge loss.

Single bit charge loss is the result of a defective memory cell that exhibits electron leakage. This leakage can be accelerated with voltage or high temperature stress and results in inferior data retention.

Intrinsic charge loss is an immediate leakage of electrons from the floating gate, closest to the tunnel oxide, after a programming pulse. The trapped charge initially causes the cell $V_t$ to appear higher than the floating gate is programmed. The leakage of these electrons after programming then causes a one time shift in the threshold voltage.

Quick charge loss also causes an immediate $V_t$ shift after a programming pulse. Quick charge loss is the result of electrons trapped in the tunnel oxide layer after the programming pulse moving back into the channel region. When a cell passes the verify operation, the cell is inhibited from further programming and quick charge loss begins. When the cell is read after the program operation has been completed, the cell has a $V_t$ that is lower than the $V_t$ obtained during the program verify operation. This can require an enlargement of the $V_t$ distribution in order to accommodate all possible threshold voltages for a given state.

FIG. 1 shows a plot of $V_{WL}$ versus time of a typical prior art programming operation with the accompanying real and ideal minimum/maximum threshold voltage of the target cell. The upper plot 100 shows the series of incrementally increasing programming pulses 101 being applied to the target cell as the word line voltage $V_{WL}$. After each programming pulse 101, a verify pulse 102 occurs at a $V_{vfy}$ level.

The lower plot 110 shows the resulting $V_t$ "distribution" of the target cell being programmed. The top $V_t$ plot 112, 116 is the maximum threshold voltage of the distribution and the lower $V_t$ plot 111, 114 is the minimum threshold voltage of the distribution as illustrated in FIG. 2. As the programming pulses 101 of the first plot 100 are applied to the target cell control gate, the $V_t$ 111, 112 increases to approximately the $V_{t\_vfy}$ level. Once at this level, the target cell is verified and inhibited from further programming. The ideal $V_t$ 113, 115 is shown staying level at $V_t$. However, the real $V_t$ 114, 116 of the target cell begins to decrease almost immediately after the last programming pulse.

FIG. 2 illustrates a typical prior art $V_t$ distribution of the programmed target cell in accordance with the $V_t$ plot of FIG. 1. In FIG. 2, the dotted line 200 represents the ideal distribution while the solid line 201 represents the real distribution. The lower end 205 of the ideal distribution 200 corresponds to the lower ideal $V_t$ plot 113 of FIG. 1 and the upper end 210 of the ideal distribution 200 corresponds to the upper ideal $V_t$ 115. Similarly, the lower end 206 of the real distribution 201 corresponds to the lower real $V_t$ plot 114 and the upper end 207 of the real distribution 201 corresponds to the upper real $V_t$ plot 116.

The lower end of the ideal distribution 200 is verified at the $V_{pgm\_vfy}$ voltage. After the programming operation and subsequent inhibition of the target cell, the distribution shifts in the negative direction by an amount equal to $V_{QCL}$ and ends at the lower $V_t$ 206. Such a shift in the distribution would necessitate an enlarged distribution that starts at the real lower $V_t$ 206 and extends to the ideal upper $V_t$ 210.

In a single level cell (SLC), a $V_t$ distribution enlargement does not have much affect on the reading of a programmed memory cell. However, in a multiple level cell (MLC) memory cell, the state distributions are typically more closely spaced in order to fit all of the states within a low supply voltage range. Enlarging the $V_t$ distributions in an MLC device can thus reduce the number of states that are programmable into the device. Additionally, the enlarged $V_t$ distributions can overlap and result in errors in reading the different states.

For the reasons stated above, and for other reasons stated below that will become apparent to those skilled in the art upon reading and understanding the present specification, there is a need in the art to reduce charge loss in a memory device.

DETAILED DESCRIPTION

Figure 1:
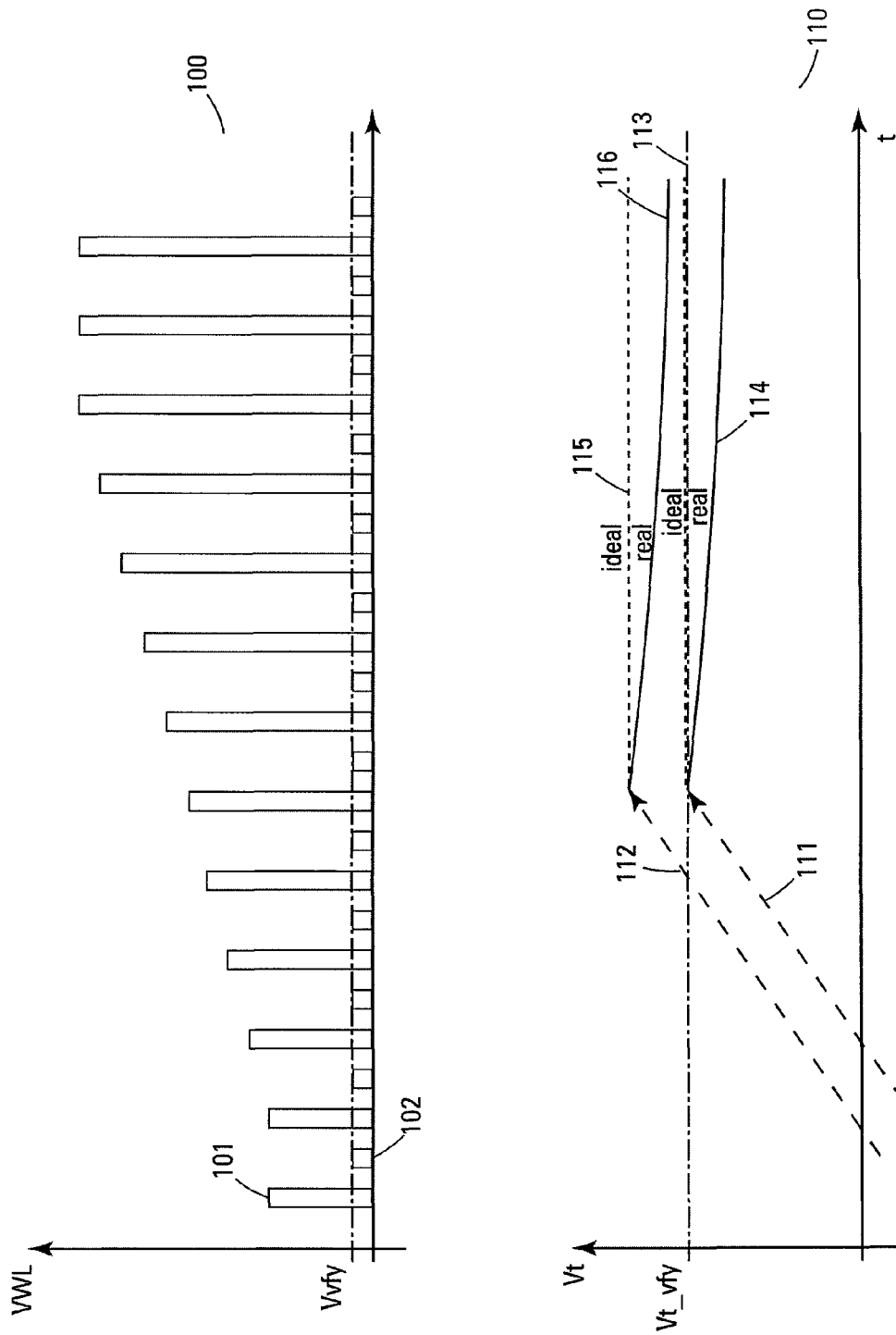
FIG. 1 shows a plot of $V_{WL}$ versus time of a typical prior art programming operation with the accompanying real and ideal $V_t$ of the target cell.
Figure 2:
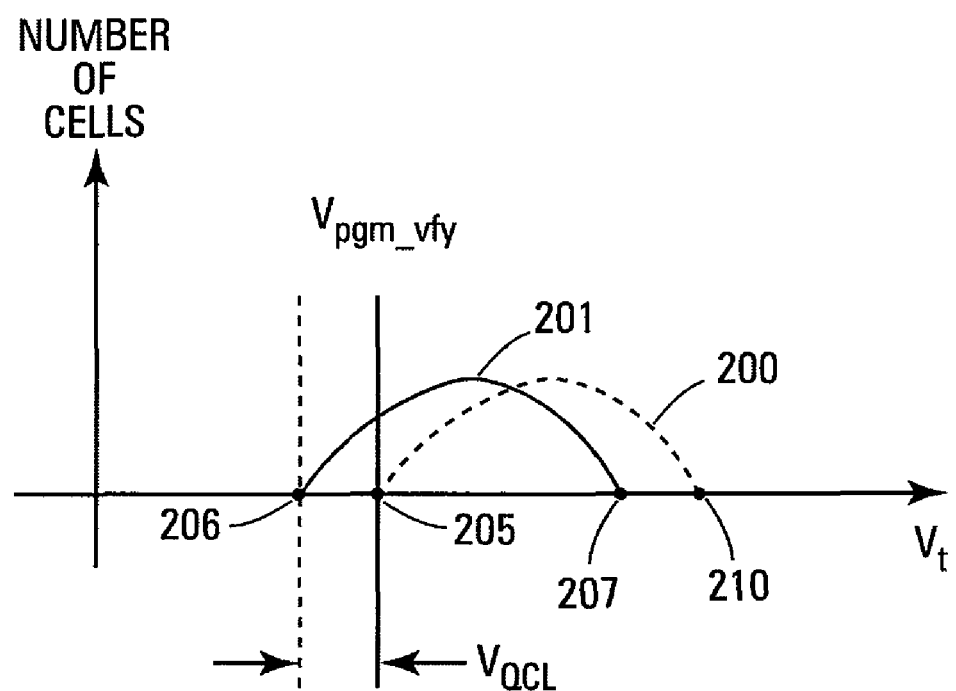
FIG. 2 shows a typical prior art $V_t$ distribution, in accordance with FIG. 1, that has been affected by quick charge loss.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
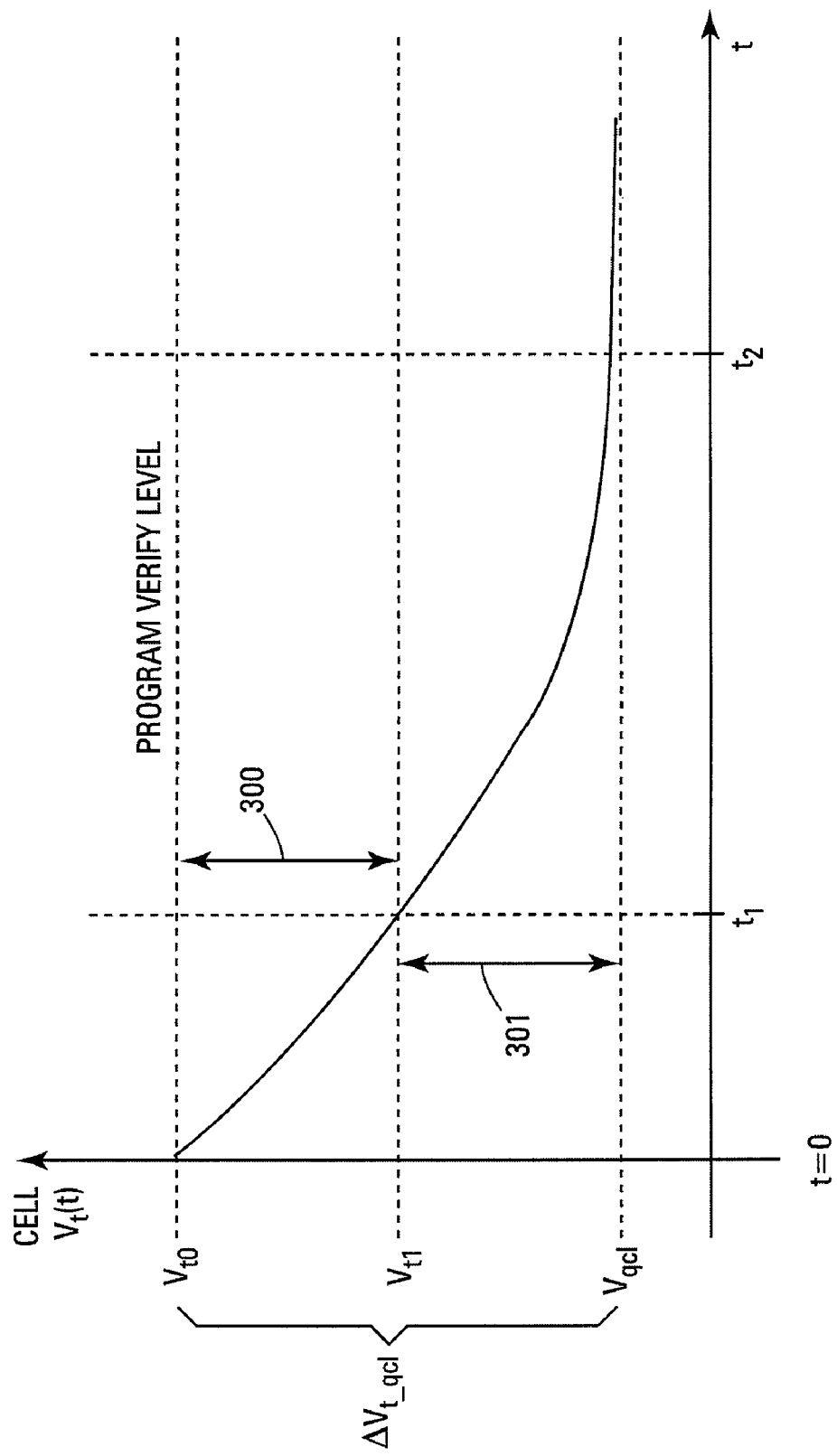
FIG. 3 shows a plot of a typical memory cell $V_t$ versus time that illustrates quick charge loss in a floating gate memory device.

FIG. 3 illustrates a plot of a typical memory cell $V_t$ versus time "t". This plot shows the quick charge loss (QCL) that occurs in a typical floating gate, non-volatile memory device. This figure shows the charge loss portion 300 that is detected by the program verify as well as the residual charge loss 301 that has an impact on read margins.

If it is assumed that a programming pulse ends at time t=0, the $V_t$ necessary to pass the verify operation is equal to $V_{t0}$. Such a $V_t$ can decay, due to QCL, to a value not lower than $V_{qcl}$. The QCL phenomenon then stops at approximately t=$t_2$. The decaying of the cell's charge depends on the time elapsed from the last programming pulse.

If the memory cell is verified as having a $V_t$ of $V_{t0}$ at time t=$t_0$ and is also inhibited at this time, the cell can have a maximum $V_t$ shift due to QCL equal to $\Delta V_{t\_qcl}=V_{t0}-V_{qcl}$. If the program verification does not occur until time $t_2$, the $V_t$ shift due to QCL could be detected and compensated by the programming algorithm since the QCL phenomenon is virtually complete by this time.

If the program verify operation is performed at t=$t_1$, the cells that experience a $V_t$ shift due to QCL below the $V_{t0}$ level do not pass the verify operation. These cells are programmed again. The maximum undetectable negative shift is $V_{t1}-V_{qcl}<V_{t0}-V_{qcl}$, relative to the cells that had $V_t=V_{t0}+(V_{t0}-V_{t1})$ at time $t_0$. By changing $t_1$, QCL versus time can be measured by measuring the residual distribution shift at the end of the program algorithm versus $t_1$. Adding a fixed wait time period between the last programming pulse and the program verify operation reduces QCL but produces a negative impact on the memory performance.

Figure 4:
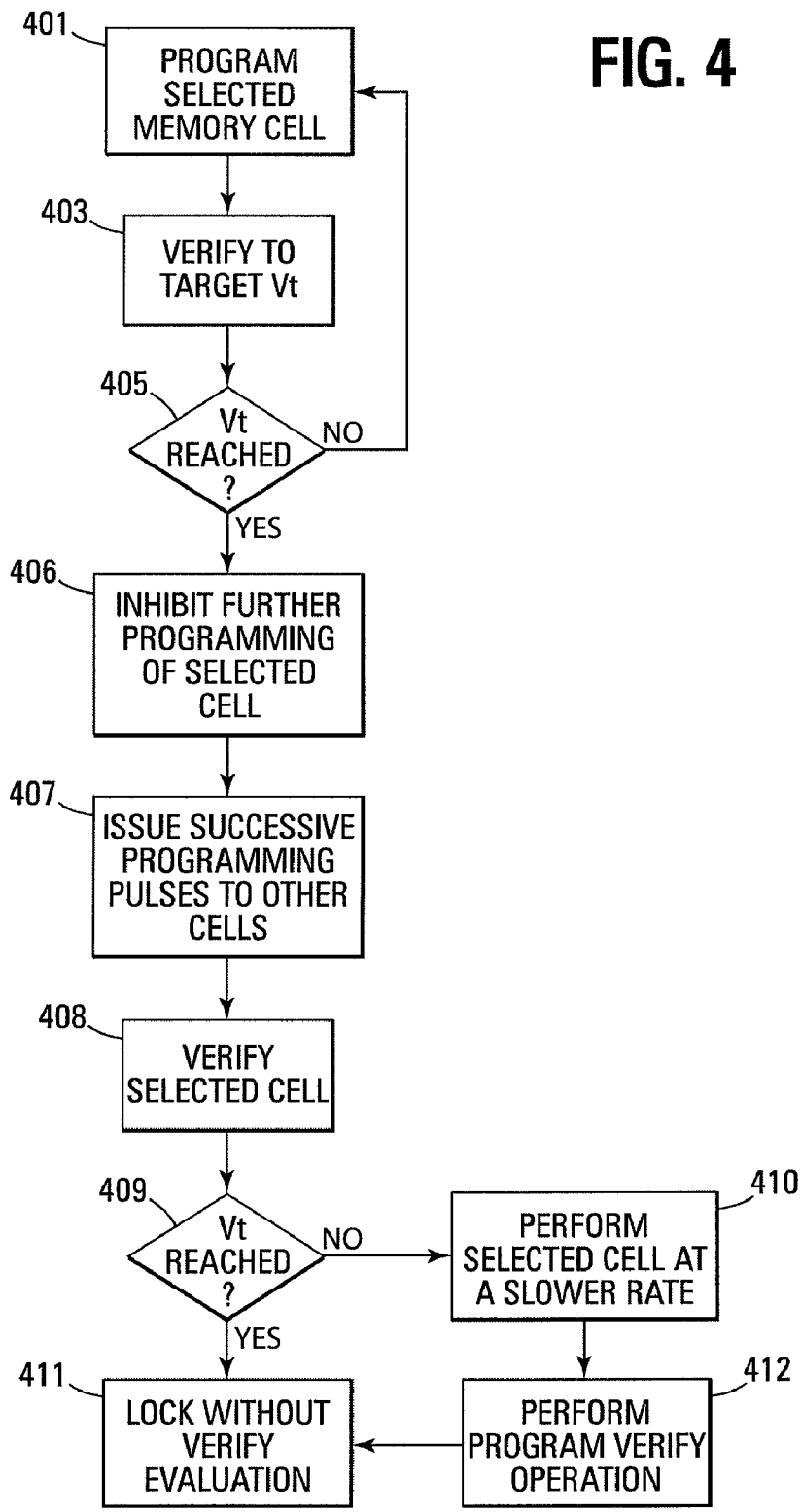
FIG. 4 shows a flowchart of one embodiment of a programming method for reducing the quick charge loss of a memory device.

The programming operation of the present disclosure can provide reduced QCL without the impact on memory performance by using one or more additional programming pulses between the last, successful programming pulse and the verify locking of the memory cell. FIG. 4 illustrates a flowchart of one embodiment of a programming method that reduces QCL in a non-volatile memory device.

The selected memory cell is programmed 401 to the target $V_t$ that is associated with the desired state. A program verify operation is performed on the selected memory cell 403 to determine if it has reached the target $V_t$ 405. If the target $V_t$ has not been reached 405, the programming/verification is repeated. Otherwise, the memory cell is inhibited from further programming 406.

In one embodiment, the memory cell is inhibited from further programming by biasing the bit line coupled to the memory cell at $V_{CC}$. The control gate of the selected memory cell may still experience the programming pulses but the bit line biased at the inhibit voltage inhibits any further programming of the cell by decreasing the gate-to-drain voltage across the memory cell.

At least one successive programming pulse is applied 407 to program other cells on the same word line (i.e., other cells having their control gates commonly coupled) as the target cell while the selected memory cell is inhibited. After at least one inhibited programming pulse, the selected memory cell is verified again 408. If the program verification determines 409 that the selected cell has a $V_t$ less than the target $V_t$ (i.e., decreased due to QCL), another programming pulse is applied 410 to the word line (i.e., the control gate) of the selected memory cell. This programming operation is performed at a slower rate than the initial programming of the selected memory cell.

In one embodiment, the slower programming rate of the final programming pulse is achieved by the bit line bias. The bit line coupled to the selected memory cell can be biased at a voltage between the inhibit supply voltage ($V_{CC}$) and ground potential. For example, a $\Delta V_{pgm}$ voltage instead of the 0V bit line bias used during a normal programming operation can be used. The $\Delta V_{pgm}$ voltage establishes a voltage difference of $\Delta V_{pgm}$ between the memory cell channel and the control gate.

Figure 5:
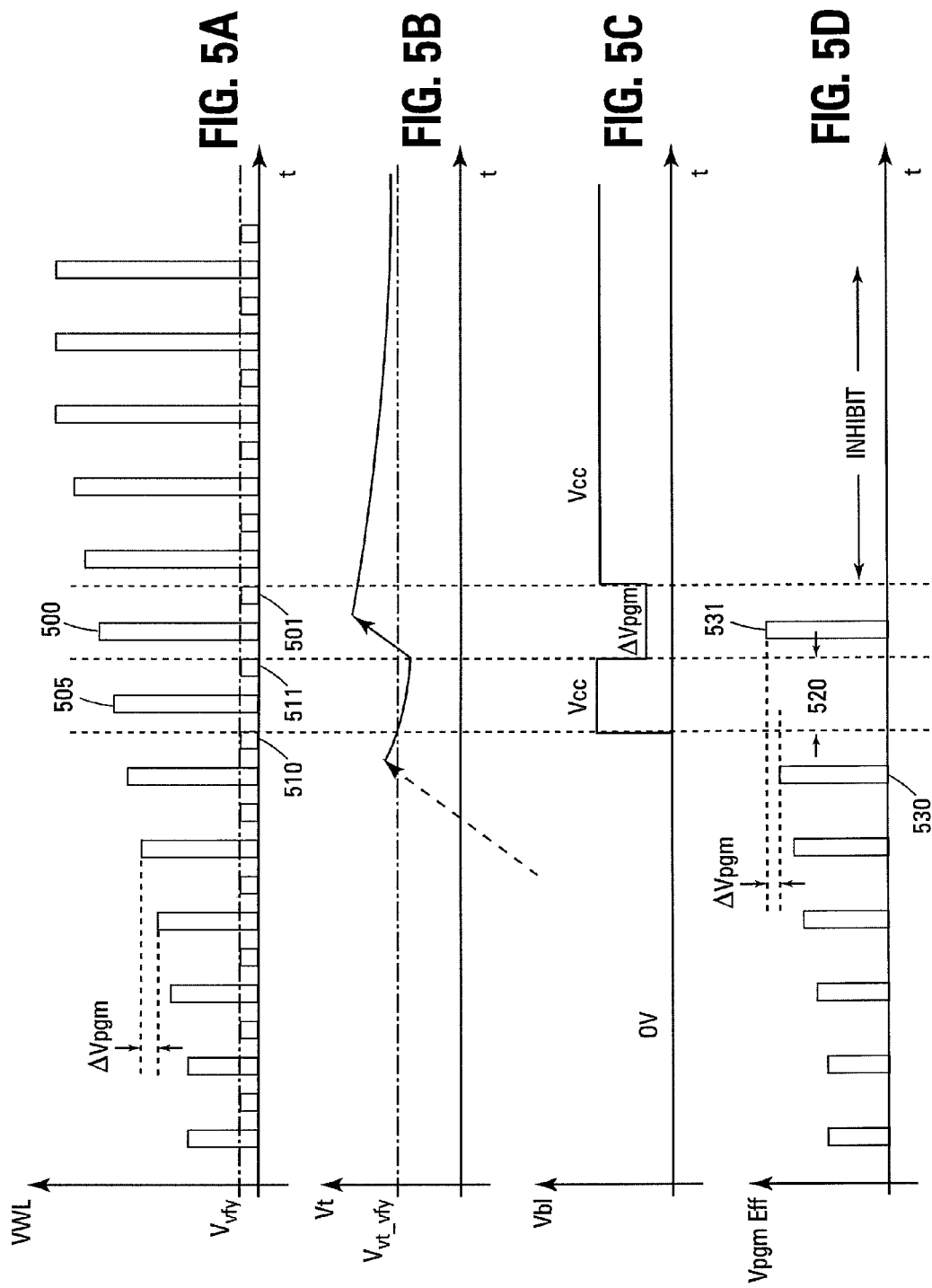
FIGS. 5A-5D show multiple plots of $V_{WL}$, $V_t$, $V_{bl}$, and $V_{pgm\_eff}$ versus time.

The $\Delta V_{pgm}$ voltage, as illustrated in FIG. 5A, is the step voltage between successive, incrementally increasing programming pulses. Without the higher bit line bias, the control gate of the selected memory cell would be exposed to a programming pulse that is 2*$\Delta V_{pgm}$ greater than a previous programming pulse since at least two incrementally increasing programming pulses have occurred since the last uninhibited programming pulse. The $\Delta V_{pgm}$ bit line bias slows the programming of the selected memory cell in order to avoid over-programming (i.e., overshooting the target $V_t$).

After the programming pulse using the slower programming rate, a program verify operation is performed 412 and the selected memory cell is definitively inhibited (i.e., locked) 411 from further programming. Only an erase operation can undo the program lock. Even though a verify operation 412 is automatically performed after each programming pulse, in this case the lock operation is performed without evaluating the program verify. The programming method is finished after all of the memory cells to be programmed have all been locked against further programming.

If the selected memory cell has reached the target $V_t$ 409, the lock without program verify evaluation is performed 411. The programming method has been completed when all of the memory cells to be programmed are locked. In one embodiment, an additional dummy programming pulse is used after the first verify pass of the last memory cell being programmed.

FIGS. 5A-5D illustrate a set of associated plots of word line voltage ($V_{WL}$) versus time (FIG. 5A), threshold voltage ($V_t$) versus time, bit line voltage ($V_{bl}$) versus time, and program effectiveness voltage ($V_{pgm\_eff}$) versus time. The $V_{pgm\_eff}$ voltage is the voltage differential between the gate and the channel region of the memory cell and, thus, the effective voltage being applied to program the selected cell.

The plots of FIGS. 5A-5D are arranged such that substantially the same point in time is lined up between all of the graphed signals in order to illustrate the effect of the programming pulses and inhibit voltages on the programming of the selected memory cell.

FIG. 5A illustrates series of incrementally increasing programming pulses that are applied to the selected word line (i.e., the control gate) in order to program the selected cell or cells. The series of programming pulses start at a minimum programming voltage (e.g., 15V) and increase by a step voltage of $\Delta V_{pgm}$ from the previous programming pulse, up to a maximum programming voltage (e.g., 20V). In one embodiment, $\Delta V_{pgm}$ is 0.5V. Alternate embodiments can use other step voltages.

After each programming pulse, a program verify pulse is applied to the word line (i.e., the control gate) at the $V_{vfy}$ voltage. This voltage turns on the selected memory cell(s) to determine whether the selected cell has been programmed to the target $V_t$. The program verify operation is comprised of turning on each memory cell being programmed and comparing the resulting current on the bit line coupled to the selected memory cell with a reference current. If the resulting current is equal to or greater than the reference current, the target $V_t$ has been reached.

The first verify pulse 510 at which the verify operation passes is illustrated as lining up with the $V_t$ of FIG. 5B that is above the $V_{vt\_vfy}$ voltage threshold. This is the threshold above which a memory cell is considered to be programmed to its target $V_t$. At this point, FIG. 5C shows that $V_{bl}$, which has been at 0V for the entire programming process, is now at $V_{CC}$ in order to inhibit further programming of the selected memory cell. FIG. 5D illustrates that the program effective voltage on the memory cell increases by $\Delta V_{pgm}$ as a result of each programming pulse. However, when the $V_{bl}$ voltage is increased to $V_{CC}$ in order to inhibit further programming of the selected memory cell, the effective program voltage is now 0V during the inhibit period 520.

FIG. 5B additionally shows that after the passing verification operation 510, the $V_t$ begins to decline due to quick charge loss as previously described. One programming pulse 505 is shown following the passing program verify 510. Alternate embodiments may use additional programming pulses. These programming pulses are applied to other memory cells on the same selected word line as the selected memory cell being programmed (i.e., those memory cells having their control gates commonly coupled). However, due to $V_{bl}$ being at an inhibit voltage (e.g., $V_{CC}$), the selected memory cell is not affected as illustrated in FIG. 5D.

Another verification operation 511 is then performed to determine the extent of the charge loss. FIG. 5B shows this verification operation as failing since $V_t$ has passed back below the $V_{t\_vfy}$ threshold. In this case, another programming pulse is issued to the selected memory cell at the same time that $V_{bl}$ is decreased to the $\Delta V_{pgm}$ voltage as seen in FIG. 5C. FIG. 5D shows that the memory cell has been exposed to a programming voltage pulse 531 that is $\Delta V_{pgm}$ greater than the last programming pulse 530 that caused the memory cell to exceed the target $V_t$.

FIG. 5A shows that another verification operation 501 is then performed. This verification 501 is not evaluated and the selected memory cell is locked from further programming by increasing $V_{bl}$ back to $V_{CC}$. FIG. 5D shows that the remaining programming pulses of FIG. 5A are ignored and the selected memory cell is inhibited from further programming. FIG. 5B shows that $V_t$ again experiences a charge loss but that the $V_t$ has started from a higher voltage than the previous successful programming and, therefore, the end result is a programmed memory cell having a $V_t$ equal to or greater than the target $V_t$. This programming is accomplished while still using extra programming pulses 500 to program other memory cells so that memory performance is not affected.

Figure 6:
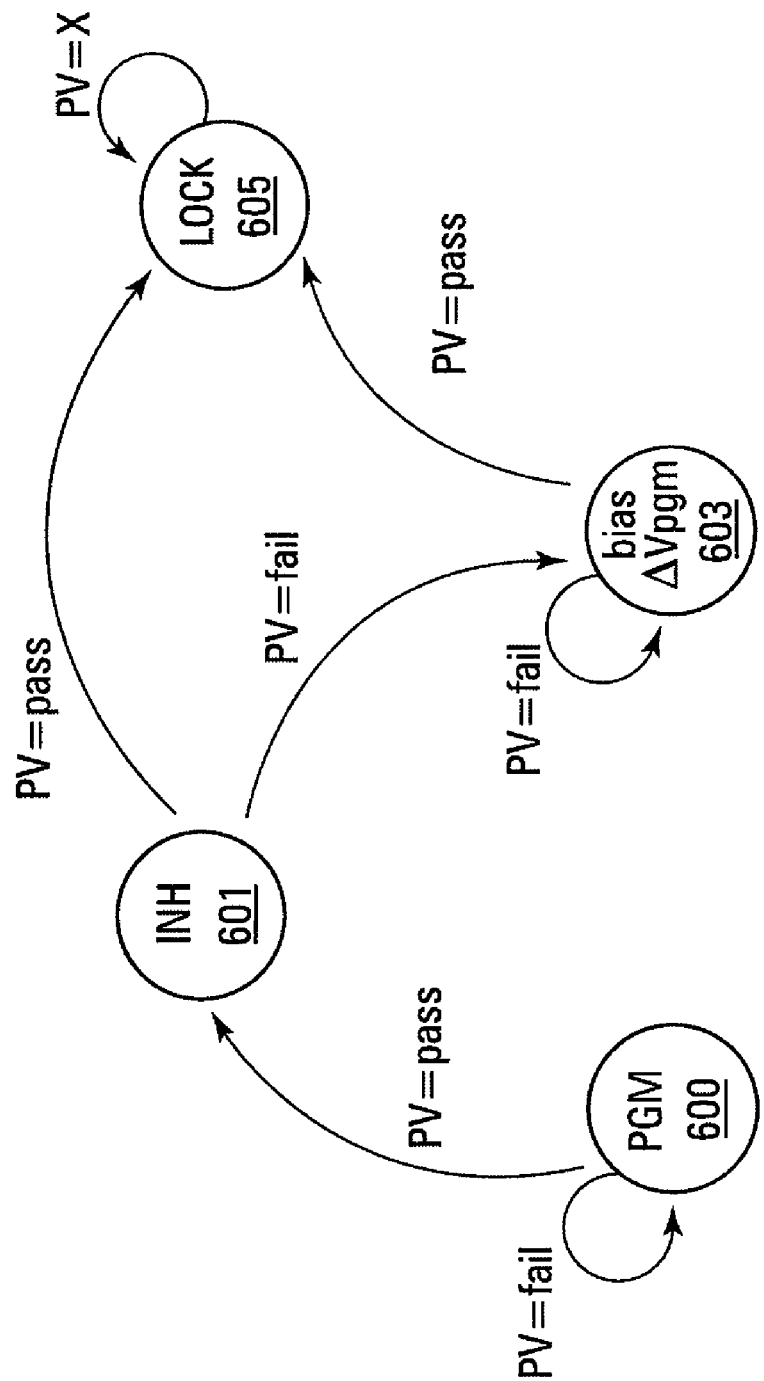
FIG. 6 shows a state diagram of one embodiment of a programming operation in accordance with the quick charge loss compensation embodiments.

FIG. 6 illustrates a state diagram of one embodiment of the method for programming as illustrated in FIGS. 4 and 5A-5D. The process begins in the programming state 600 where the $V_t$ is lower than the target value. In this state 600, the selected memory cell is receiving programming pulses and program verify (PV) operations are occurring. In this state, the bit line is set to 0V and the $V_t$ shift is equal to the $V_{pgm}$ step voltage. While the PV fails, the state remains as the programming state 600. After the PV initially passes the $V_t$ target value, the state moves to the inhibit state 601.

While in the inhibit state 601, the bit line is biased at $V_{CC}$ and the word line that is connected to the selected memory cell is receiving at least one additional programming pulse. The $V_t$ in this state remains at 0V since the series string of memory cells connected to the bit line is inhibited. However, this inhibit is not necessarily permanent.

After the additional programming pulses that occur while the bit line is inhibited, another programming verify operation is performed. If this verify still passes, the state passes to the locked state 605. The verify operation would pass if the selected memory cell had been programmed to a high enough $V_t$ that the quick charge loss did not shift the $V_t$ lower than the target $V_t$. The $V_t$ could also have remained high enough to pass if the quick charge loss was not enough to shift the $V_t$ below the threshold.

If the programming verify operation performed in the inhibit state 601 fails, the state moves to the bias $\Delta V_{pgm}$ state 603. To get to this state, the selected memory cell has passed the previous verify operation while in the program state 600 but failed the verify operation while in the inhibit state 601. While in the $\Delta V_{pgm}$ state, the bit line is biased at the $V_{pgm}$ step voltage (i.e., $\Delta V_{pgm}$). Also in this state 603, the $V_t$ increments by $\Delta V_{pgm}$ While the program verify operations fail, the state remains as the bias $\Delta V_{pgm}$ state 603. When the program verify operation passes, the programming method moves to the locked state 605.

While in the locked state 605, the bit line is biased at VCC in order to inhibit further programming of the selected memory cell on the selected word line. Therefore, the $V_t$ shift is 0 in this state 605 no matter how many programming pulses are issued. The selected memory cell remains in the locked state 605 until the memory block of which the selected cell is a part is erased.

The above-described embodiments can be implemented in a non-volatile memory device, such as a flash memory device, that is programmable in any bit density. For example, the memory device may have a single level cell (SLC) NAND flash memory array that stores a single bit (i.e., a logical "1" or a logical "0"), a multiple level cell (MLC) NAND flash memory array that stores multiple bits (i.e., a logical "10"), or the memory array can have a combination of SLC and MLC memory cells.

Figure 7:
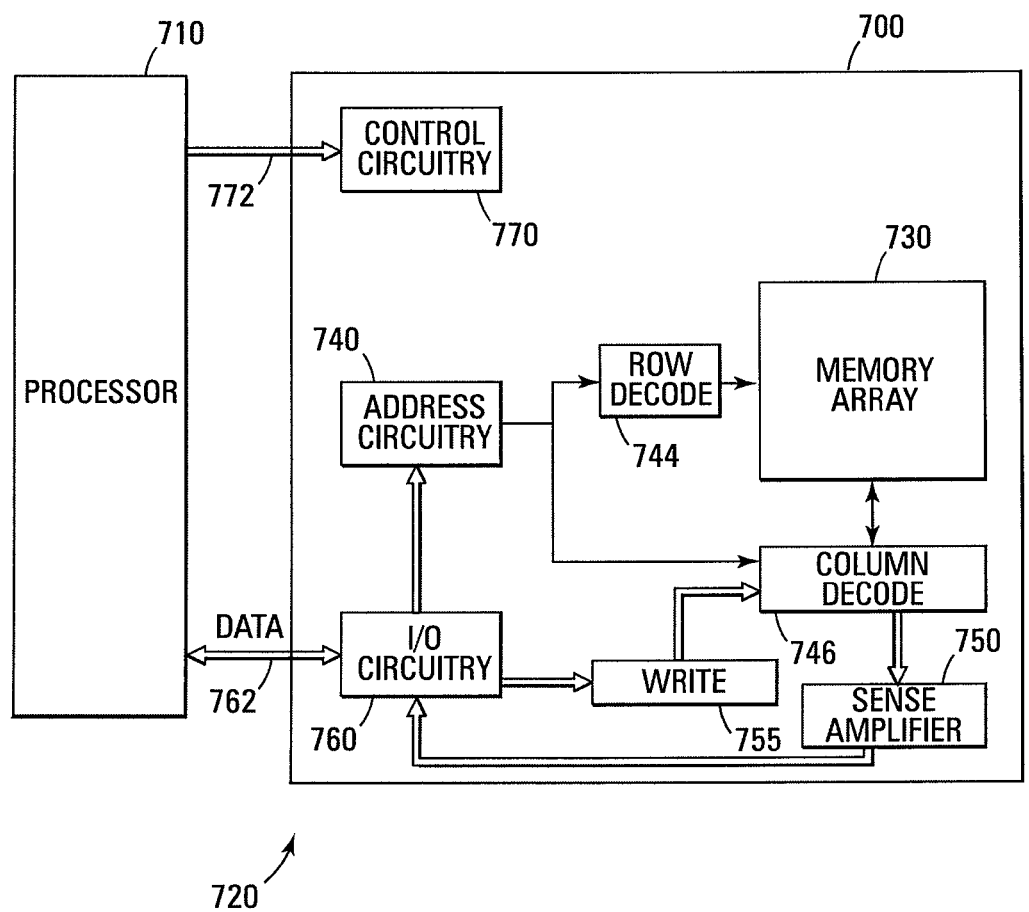
FIG. 7 shows a block diagram of one embodiment of a memory system that can incorporate the quick charge loss embodiments of the present disclosure.

FIG. 7 illustrates a functional block diagram of a memory device 700. The memory device 700 is coupled to an external processor 710. The processor 710 may be a microprocessor or some other type of controlling circuitry. The memory device 700 and the processor 710 form part of a memory system 720.

The memory device 700 has been simplified to focus on features of the memory that are helpful in understanding the present invention.

The memory device 700 includes an array 730 of non-volatile memory cells. The memory array 730 is arranged in banks of word line rows and bit line columns. In one embodiment, the columns of the memory array 730 are comprised of series strings of memory cells. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense amplifier circuitry 750. The sense amplifier circuitry 750, in one embodiment, is coupled to read and latch a row of data from the memory array 730. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the processor 710. These signals are used to control the operations on the memory array 730, including data read, data write (program), and erase operations. The memory controller circuitry 770 may be a state machine, a sequencer, or some other type of controller to generate the memory control signals. In one embodiment, the memory control circuitry 770 is configured to execute the programming method of the present embodiments in order to compensate for quick charge loss.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments provide compensation for quick charge loss in a memory device during a programming operation. In one such embodiment, target memory cell, after a successful program verify operation, is inhibited while at least one additional programming pulse is issued. A program verify operation is then performed on the target memory cell. If the target memory cell fails the verify operation, the bit line coupled to the target cell is then biased at $\Delta V_{pgm}$ for a final programming pulse. The $\Delta V_{pgm}$ biasing of the bit line slows the movement of the target cell $V_t$ during programming. Alternate embodiments can use other ways to slow the programming of the target memory cell to a slower rate than the initial programming. The target cell is then locked from further programming by the biasing of the bit line at $V_{CC}$.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for quick charge loss compensation in a memory device, the method comprising:
   biasing a selected memory cell, coupled to a selected word line, with programming pulses until the selected memory cell passes a first program verify operation;
   biasing the selected memory cell with an additional programming pulse in response to the selected memory cell failing a second program verify operation that follows the first program verify operation, while a bit line coupled to the selected memory cell is biased to slow programming of the selected memory cell; and
   biasing the bit line at an inhibit voltage without evaluating a third program verify operation in response to a final programming pulse.

2. The method of claim 1 and further including inhibiting programming of the selected memory cell, between the first and second program verify operations, while other memory cells coupled to the selected word line are biased with additional programming pulses.

3. The method of claim 1 wherein biasing the bit line at the inhibit voltage without evaluating comprises inhibiting programming of the selected memory cell until a subsequent erase operation is performed.

4. The method of claim 1 wherein biasing the selected memory cell with programming pulses comprises biasing the selected word line with a plurality of incrementally increasing pulses such that each subsequent pulse is increased by a step voltage of $\Delta V_{pgm}$ over the preceding pulse.

5. The method of claim 4 wherein the bit line is biased at $\Delta V_{pgm}$ to slow programming of the selected memory cell.

6. The method of claim 1 wherein the inhibit voltage is $V_{CC}$.

7. A method for quick charge loss compensation in a non-volatile memory device, the method comprising:
   programming, at a first programming rate, a selected memory cell that is coupled to a selected word line;
   inhibiting programming of the selected memory cell in response to the selected memory cell passing a first program verify operation during the programming;
   continuing to program additional memory cells coupled to the selected word line while the selected memory cell is inhibited;
   performing a second program verify operation on the selected memory cell after the first program verify operation; and
   programming the selected memory cell at a second programming rate in response to failing the second program verify operation.

8. The method of claim 7 wherein the second programming rate is slower than the first programming rate.

9. The method of claim 7 wherein the second programming rate is determined in response to biasing of a bit line coupled to the selected memory cell.

10. The method of claim 9 wherein the biasing of the bit line is a voltage between $V_{CC}$ and ground potential.

11. A method for programming a NAND flash memory device, the method comprising:
   biasing a selected word line, coupled to a selected memory cell, with a plurality of programming pulses, each programming pulse having an associated program verify operation and the plurality of programming pulses starting at a minimum programming voltage and increasing by a step voltage over a preceding programming pulse;

inhibiting programming of the selected memory cell after the selected memory cell passes a first program verify operation;

biasing the selected word line with at least one programming pulse while the selected memory cell is inhibited;

performing a second program verify operation on the selected memory cell;

if the program verify operation fails, biasing the selected word line with a final programming pulse while biasing a bit line coupled to the selected memory cell at the step voltage; and locking the selected memory cell from further programming.

12. The method of claim 11 wherein each program verify operation is comprised of a verify pulse.

13. The method of claim 11 and further including performing a final program verify operation after the final programming pulse wherein the final program verify operation is not evaluated.

14. The method of claim 11 and further comprising biasing the bit line at 0V while biasing the selected word line with the plurality of programming pulses.

15. The method of claim 11 wherein the plurality of programming pulses program the selected memory cell with multiple bits.

16. The method of claim 11 wherein locking the selected memory cell comprises biasing the bit line at $V_{CC}$ until a subsequent erase operation is performed.

17. A non-volatile memory device comprising:
a memory array comprising a plurality of memory cells coupled to word lines and bit lines; and
a memory controller coupled to the memory array for controlling operation of the memory array wherein the memory controller is configured to execute a programming operation of a selected memory cell on a selected word line that includes a bias of the selected word line with incrementally increasing programming pulses until the selected memory cell passes a first program verify operation, a bias of the selected word line with at least one programming pulse while the selected memory cell is program inhibited, a bias of the selected memory cell with a final programming pulse when the selected memory cell fails a second program verify operation while a bit line coupled to the selected memory cell is biased with a voltage greater than ground potential, and a bias of the bit line at an inhibit voltage without evaluating a third program verify operation after the final programming pulse.

18. The memory device of claim 17 wherein the device is a NAND flash memory device.

19. The memory device of claim 17 wherein the plurality of memory cells are floating gate memory cells.

20. The memory device of claim 17 wherein the plurality of memory cells are configured to be multiple level cells, single level cells, or a combination of multiple level and single level cells.

21. A memory system comprising:
a processor for controlling operation of the memory system and generating memory signals; and
a non-volatile memory device coupled to the processor and operating in response to the memory signals, the memory device comprising:
a memory array comprising a plurality of memory cells coupled to word lines and bit lines; and
a memory controller coupled to the memory array for controlling operation of the memory array wherein the memory controller is configured to bias a selected word line with programming pulses that increase by a step voltage from a previous programming pulse until a selected memory cell passes a first program verify operation, inhibit programming of the selected memory cell while continuing to bias the selected word line with at least one programming pulse, bias the selected word line with a final programming pulse when the selected memory cell fails a second program verify operation that follows the first program verify operation while a bit line coupled to the selected memory cell is biased with the step voltage, and wherein the bit line is biased at an inhibit voltage without evaluating a third program verify operation after the final programming pulse.

22. The system of claim 21 wherein the non-volatile memory device is one of a NAND flash memory device or a NOR flash memory device.

23. The system of claim 21 wherein the memory array is comprised of a combination of both single level memory cells and multiple level memory cells.

* * * * *